United States Patent
Lee

(10) Patent No.: US 7,660,564 B2
(45) Date of Patent: Feb. 9, 2010

(54) HIGH-POWER AMPLIFIER APPARATUS FOR TDD WIRELESS COMMUNICATION SYSTEM

(75) Inventor: Jong-Hyun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 492 days.

(21) Appl. No.: 11/600,511

(22) Filed: Nov. 16, 2006

(65) Prior Publication Data
US 2007/0111686 A1      May 17, 2007

(30) Foreign Application Priority Data
Nov. 16, 2005    (KR) ...................... 10-2005-0109594

(51) Int. Cl.
*H01Q 11/12*      (2006.01)
*H04B 1/04*       (2006.01)
*H03F 3/04*       (2006.01)

(52) U.S. Cl. ................ 455/127.1; 455/127.3; 455/572; 330/296; 330/297

(58) Field of Classification Search .............. 455/127.1, 455/127.3, 127.5, 231, 571, 572, 574; 330/296, 330/297, 285, 133
See application file for complete search history.

(56) References Cited

U.S. PATENT DOCUMENTS

| | | | | |
|---|---|---|---|---|
| 5,250,912 A | * | 10/1993 | Fujita | .......................... 330/285 |
| 5,251,331 A | * | 10/1993 | Schwent et al. | .......... 455/127.4 |
| 5,278,517 A | * | 1/1994 | Fujita | .......................... 330/279 |
| 5,426,641 A | * | 6/1995 | Afrashteh et al. | ........... 370/347 |
| 6,122,488 A | * | 9/2000 | Leizerovich et al. | .......... 455/78 |
| 6,166,591 A | * | 12/2000 | Schultz et al. | ............... 327/544 |
| 6,418,304 B1 | * | 7/2002 | Morrar | ..................... 455/343.1 |
| 6,614,309 B1 | * | 9/2003 | Pehlke | .......................... 330/296 |
| 2003/0184382 A1 | * | 10/2003 | Tsutsui et al. | ................ 330/285 |
| 2004/0113700 A1 | * | 6/2004 | Arai et al. | ..................... 330/296 |

FOREIGN PATENT DOCUMENTS

| | | |
|---|---|---|
| KR | 1020020078393 | 10/2002 |
| KR | 1020060032336 | 4/2006 |
| KR | 1020070023061 | 2/2007 |

* cited by examiner

*Primary Examiner*—Duc M Nguyen
(74) *Attorney, Agent, or Firm*—The Farrell Law Firm, LLP

(57) ABSTRACT

Provided is an HPA apparatus for a TDD wireless communication system. In the HPA apparatus, a power amplifier amplifies the power of an input signal. A gate bias controller turns on/off a gate bias of the power amplifier in accordance with a TDD control signal. A constellation error optimizer circuit removes a current fluctuation and a power noise, which occur when the gate bias controller turns on/off the power amplifier in a TX mode, to stabilize a drain bias thereof.

17 Claims, 11 Drawing Sheets

HIGH-POWER AMPLIFIER APPARATUS FOR TDD WIRELESS COMMUNICATION SYSTEM

PRIORITY

This application claims priority under 35 U.S.C. § 119 to an application filed in the Korean Intellectual Property Office on Nov. 16, 2005 and allocated Serial No. 2005-109594, the contents of which are incorporated herein by reference.

BACKGROUND OF THE INVENTION

1. Field of the Invention

The present invention relates generally to a radio frequency (RF) front-end apparatus for a Time Division Duplex (TDD) wireless communication system, and in particular, to an apparatus for suppressing an increase in an RX noise level due to the output of a high-power amplifier (HPA).

2. Description of the Related Art

In a TDD wireless communication system, an HPA is always in an ON state and a TDD scheme is implemented using a bursty RF input signal, an RF switch, or a circulator.

FIG. 1 is a block diagram of a conventional RF front-end device using an RF switch.

Referring to FIG. 1, an HPA 102 is connected to an output of a transmitter 101 and a receiver 103 is connected to an output of a low-noise amplifier (LNA) 104. In a TX mode, a single-pole double-throw (SPDT) switch 105 is switched such that a TX signal from the HPA 102 is transmitted to a filter 106. In an RX mode, the SPDT switch 105 is switched such that an RX signal from the filter 106 is transmitted to the LNA 104. The SPDT switch 105 operates to convert a TX/RX path in accordance with a TX/RX control signal. The filter 106 band-filters a TX signal and an RX signal. The conventional RF front-end device illustrated in FIG. 1 is used mainly in low-power (less than 1 W) communication systems.

FIG. 2 is a block diagram of a conventional RF front-end device using a circulator.

Referring to FIG. 2, an HPA 202 is connected to an output of a transmitter 201 and a receiver 203 is connected to an output of an LNA 204. In a TX mode, a circulator 205 operates such that a TX signal from the HPA 202 is transmitted to a filter 206. In an RX mode, the circulator 205 operates such that an RX signal from the filter 206 is transmitted to an RF switch 207. In the TX mode, the RF switch 207 is turned off to protect the LNA 204. In the RX mode, the RF switch 207 is turned on to transmit an RX signal from the circulator 205 to the LNA 204. In this way, forward signal are transmitted with little signal loss, reverse TX/RX signals are separated using the circulator 204 with high signal loss, and the RF switch 207 is used to control the input of the LNA 204 in the TX/RX modes. The conventional RF front-end device illustrated in FIG. 2 is used mainly in lower-power (less than 7~8 W) communication systems.

In the RF front-end devices illustrated in FIGS. 1 and 2, the HPAs 102 and 202 are always in an ON state. As described above, the conventional RF front-end devices can be applied to TDD communication systems using low-power RF signals. However, in terms of the power rating and breakdown of the SPDT switch 105 and the circulator 205, the conventional RF front-end devices are problematic in communication system using high-power (more than about 10 W) RF signals. In addition, high-power SPDT switches are expensive to implement and use.

Compared to the RF front-end device illustrated in FIG. 1, the RF front-end device illustrated in FIG. 2 can be implemented at a lower price and can process a higher-power signal. However, the RF front-end device illustrated FIG. 2 is problematic in that the output level of the HPA 202 in an RX mode is much higher than a noise level and that the noise level of the receiver may increase when the high output power of the HPA 202 flows through the circulator 205 into the LNA 204. For example, when the input power level of the HPA 202 is −70 dBm in an RX mode, the output power level of the HPA 202 can be calculated according to Equation (1):

$$-70\ \text{dBm} + 55\ \text{dB(HPA gain)} = -15\ \text{dBm}/10\ \text{MHz} \tag{1}$$

The related standards provide that the output level of the HPA in an RX mode is "−96 dBm". "−15 dBm/10 MHz" is much greater than the standard output level of the HPA. When a large leakage power is output from the HPA in an RX mode as described above, a corresponding signal-to-noise ratio (SNR) decreases. This may reduce the RX sensitivity and damage the LNA.

SUMMARY OF THE INVENTION

An object of the present invention is to substantially solve at least the above problems and/or disadvantages and to provide at least the advantages below. Accordingly, an object of the present invention is to provide an RF front-end apparatus that can process a high-power RF signal in a TDD wireless communication system.

Another object of the present invention is to provide an apparatus that prevents the output power of an HPA from flowing into an LNA in an RX mode in a TDD wireless communication system.

A further object of the present invention is to provide an apparatus that removes a current fluctuation and a power noise, which may occur when a bias controller turns on the gate bias of a main amplifier and a drive amplifier in a TX mode in a TDD wireless communication system, and thus provides a stable drain bias to the drive amplifier and the main amplifier, thereby reducing a constellation error.

Still another object of the present invention is to provide an apparatus that controls a bias voltage to turn off an HPA in an RX mode in a TDD wireless communication system.

Yet another object of the present invention is to provide an apparatus that attenuates noise leakage power generated from an HPA in an RX mode in a TDD wireless communication system.

According to one aspect of the present invention, there is provided an HPA apparatus for a TDD wireless communication system, that includes a power amplifier for amplifying the power of an input signal; a gate bias controller for turning on/off a gate bias of the power amplifier in accordance with a TDD control signal; and a constellation error optimizer circuit for removing a current fluctuation and a power noise, which occur when the gate bias controller turns on/off the power amplifier in a TX mode, to stabilize a drain bias thereof.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

The present invention is intended to provide an RF front-end apparatus that attenuates noise leakage power, which flows into an LNA in an RX mode in a TDD wireless communication system, thereby improving an RX SNR.

Figure 3:
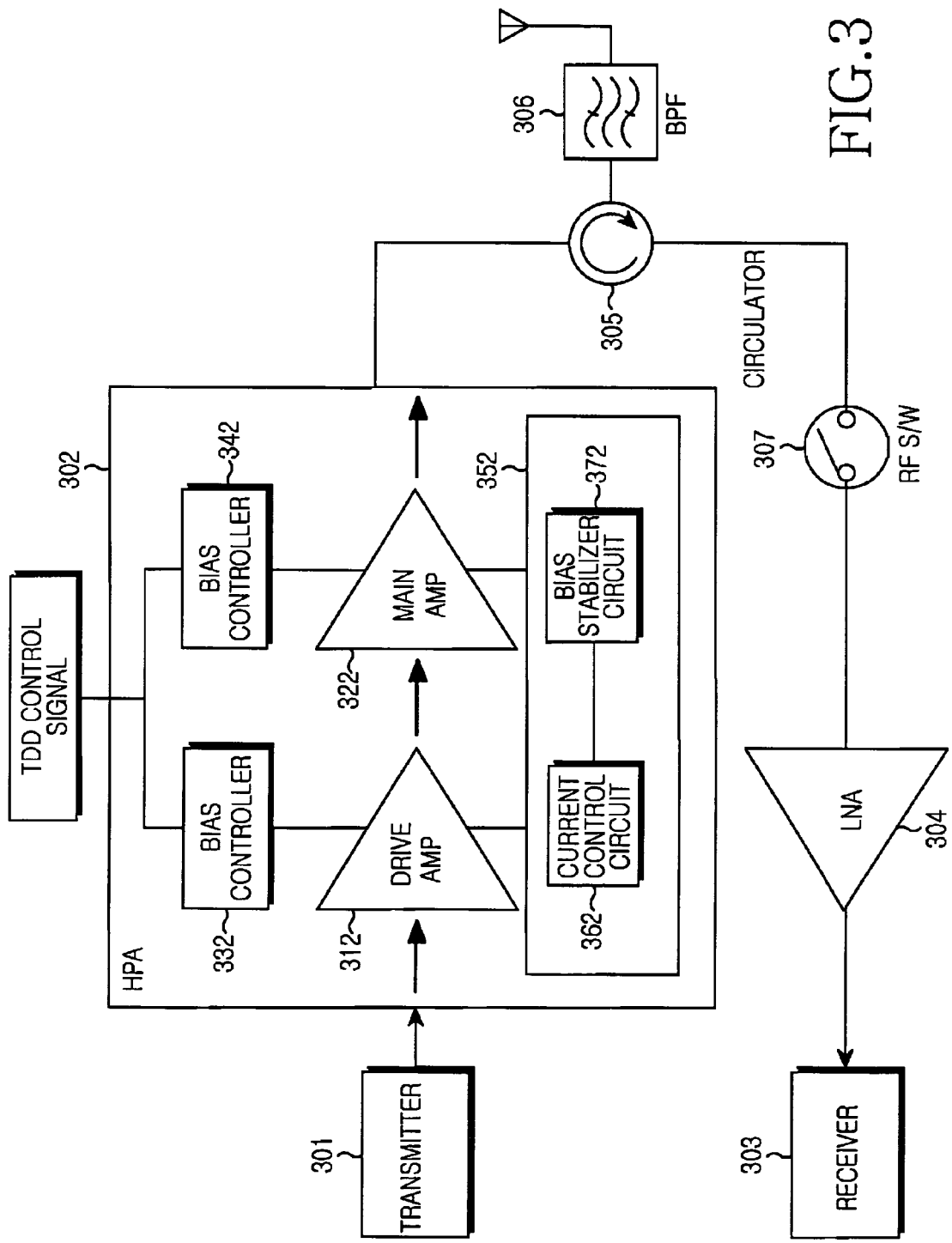
FIG. 3 is a block diagram of an RF front-end apparatus for a TDD wireless communication system according to the present invention.

FIG. 3 is a block diagram of an RF front-end apparatus for a TDD wireless communication system according to the present invention.

Referring to FIG. 3, the RF front-end apparatus includes a transmitter 301, an HPA 302, a receiver 303, an LNA 304, a circulator 305, a filter 306, and an RF switch 307. The HPA 302 includes a drive amplifier 312, a first bias controller 332 for controlling the gate bias of the drive amplifier 312, a main amplifier 322, a second bias controller 342 for controlling the gate bias of the main amplifier 322, and a constellation error optimizer circuit 352 for reducing a constellation error. The constellation error optimizer circuit 352 includes a current control circuit 362 and a bias stabilizer circuit 372. The current control circuit 362 operates to remove a current fluctuation that occurs due to the on/off switching of the gate bias. The bias stabilizer circuit 372 supplies a stable voltage and removes a power noise to stabilize a drain bias.

The drive amplifier 312 is implemented using a middle-power transistor, while the main amplifier 322 is implemented using a high-power transistor.

In a TX mode, the first bias controller 332 and the second bias controller 342 turn on the gate biases of the drive amplifier 312 and the main amplifier 322 respectively in accordance with a TDD control signal that is received from a system. In this case, the constellation error optimizer circuit 352 provides a stable drain bias to a drain of the drive amplifier 312 and a drain of the main amplifier 322, and the HPA 302 amplifies the power of a TX signal received from the transmitter 301.

In an RX mode, the first bias controller 332 and the second bias controller 342 turn off the gate bias of the drive amplifier 312 and the main amplifier 322 in accordance with a TDD control signal that is received from the system. In this case, the HPA 302 stops an amplifying operation. Although not illustrated in FIG. 3, an isolator is provided at the output stage of the HPA 302 to protect the terminal circuit of the HPA 302.

In accordance with the illustrated directionality, the circulator 305 transmits a signal from the HPA 302 to the filter 306 and transmits a signal from the filter 306 to the RF switch 307. The circulator 305 provides a signal isolation of about 20 dB between a TX signal path and an RX signal path. The circulator 305 also provides a path loss of 0.3 dB between an antenna and a TX/RX path.

The filter 306 is connected between the circulator 305 and the antenna and band-filters a TX signal and an RX signal. In a TX mode, the RF switch 307 is turned off to protect the LNA 304. In an RX mode, the RF switch 307 is turned on to transmit an RX signal from the circulator 305 to the LNA 304. The RF switch 307 may be implemented using a single-pole single-throw (SPST) switch or a positive-intrinsic-negative (PIN) diode. The LNA 304 low-noise-amplifies a signal from the RF switch 307 and outputs the amplified signal to the receiver 303.

Figure 4:
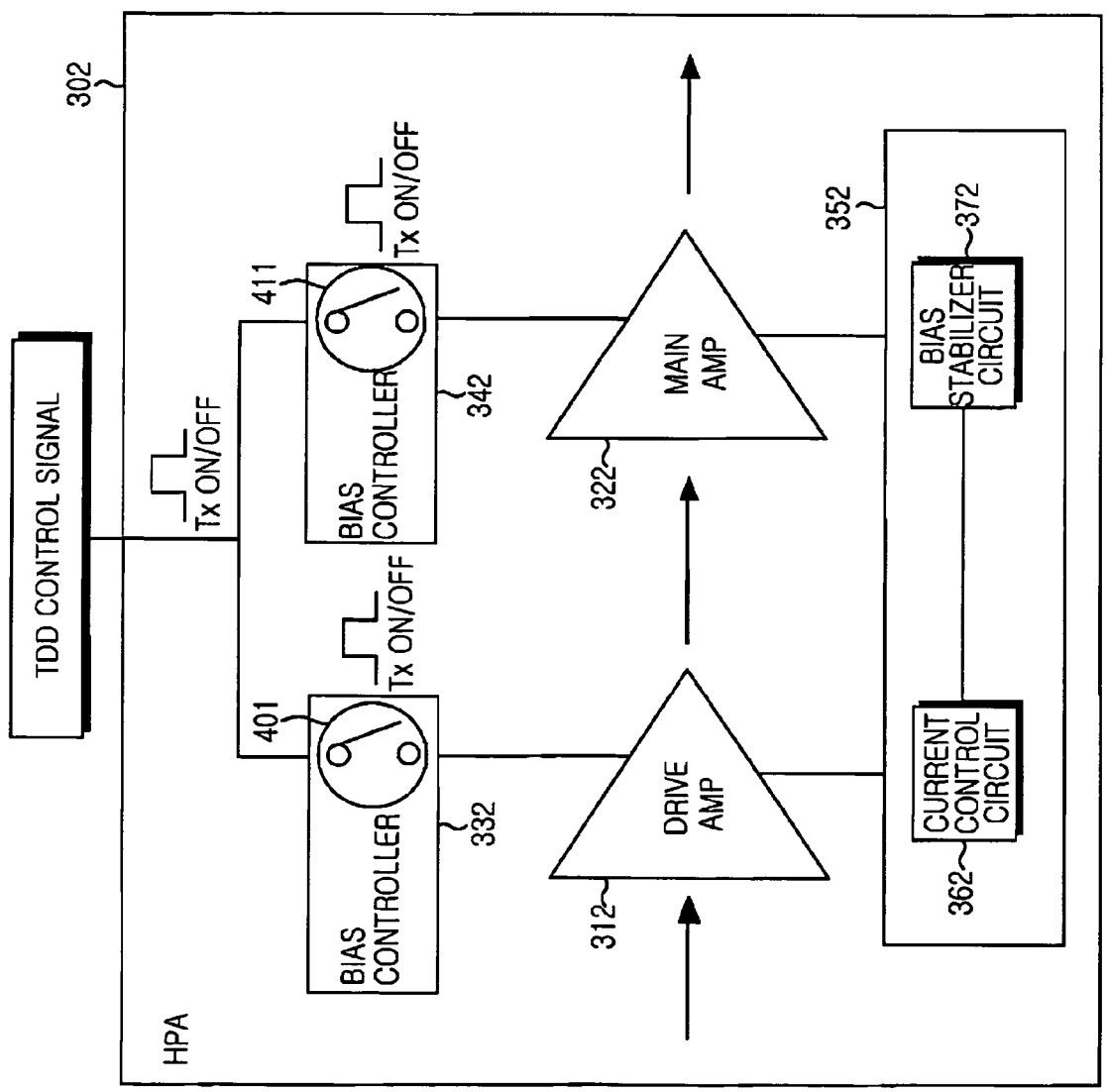
FIG. 4 is a diagram illustrating the detailed structure of an HPA in a TDD wireless communication system according to the present invention.

FIG. 4 is a diagram illustrating a detailed structure of the HPA 302 according to the present invention.

Referring to FIG. 4, the HPA 302 includes a drive amplifier 312, a first bias controller 332 for controlling the gate bias of the drive amplifier 312, a main amplifier 322, a second bias controller 342 for controlling the gate bias of the main amplifier 322, and a constellation error optimizer circuit 352 for providing a stable bias to reduce a constellation error. The first bias controller 332 includes a first switch 401 for turning on/off the gate bias of the drive amplifier 312. Likewise, the second bias controller 342 includes a second switch 411 for turning on/off the gate bias of the main amplifier 322. The detailed structures of the first and second bias controllers 332 and 342 will be described later with reference to FIG. 5. In addition, the detailed structures of the constellation error optimizer circuit 352 will be described later with reference to FIG. 6.

In a TX mode, the first switch 401 and the second switch 411 operate to turn on the gate biases of the drive amplifier 312 and the main amplifier 322 in accordance with a TDD control signal that is received from a system. In this case, the constellation error optimizer circuit 352 provides a stable bias to the drive amplifier 312 and the main amplifier 322, and the HPA 302 amplifies the power of a TX signal received from the transmitter 301. The TDD control signal received from the system is used to actually perform gate bias control for transistor-transistor logic (TTL) or low-voltage TTL (LVTTL).

In an RX mode, the first switch 401 and the second switch 411 operate to turn off the gate biases of the drive amplifier 312 and the main amplifier 322 in accordance with a TDD control signal that is received from the system. In this case, the HPA 302 stops an amplifying operation.

In an RX mode, the gate bias of the HPA 302 is turned off to temporarily stop any amplification of the HPA 302, thereby attenuating TX noise leakage power. An RF signal applied to the HPA 302 is a burst source and must synchronize with the TDD control signal for smooth TDD communication. In a communication system with an on/off time of several microseconds, an RF front-end apparatus must be designed in careful consideration of a time delay on a path and a time delay in each device. The first switch 401 and the second switch 411 are SPST switches that perform a high-speed switching operation with a switching time of several microseconds or less. Because a high-power transistor has an on/off delay of several nanoseconds much less than an on/off time of an SPST switch, it can smoothly control the on/off operations of the main amplifier 322 and the drive amplifier 312.

Figure 5:
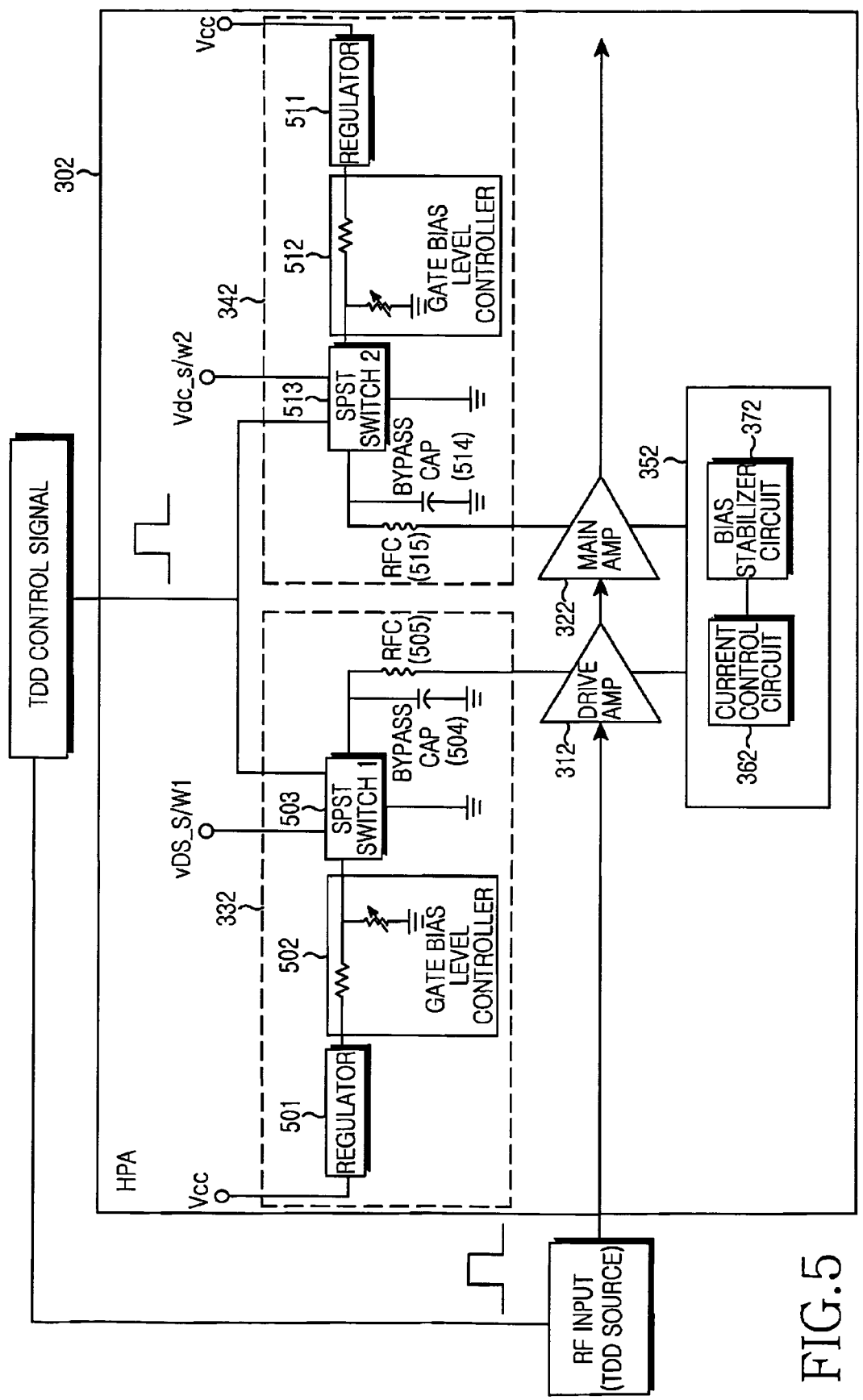
FIG. 5 is a diagram illustrating the detailed structure of a bias controller illustrated in FIG. 4.

FIG. 5 is a diagram illustrating the detailed structure of the bias controller illustrated in FIG. 4. A structure for controlling the gate bias of the drive amplifier 312 is identical to a structure for controlling the gate bias of the main amplifier 322. Thus, the following description will focus on the structure for controlling the gate bias of the drive amplifier 312, for conciseness.

Referring to FIG. 5, the first bias controller 332 includes a regulator 501, a gate bias level controller 502, an SPST switch 503, a bypass capacitor 504, and a radio-frequency chock (RFC) 505. Likewise, the second bias controller 342 includes a regulator 511, a gate bias level controller 512, an SPST switch 513, a bypass capacitor 514, and an RFC 515.

The regulator 501 converts a DC voltage from a power source Vcc into a positive voltage. Using a variable resistor, the gate bias level controller 502 converts the positive voltage from the regulator 501 into a voltage corresponding to a predetermined bias level. The class of the amplifier is determined according to the predetermined bias level. In accordance with the TDD control signal from the system, the SPST switch 502 is turned on in a TX mode and turned off in an RX mode. The gate bias of the drive amplifier 312 is turned on/off in accordance with the TDD control signal. When the gate bias is turned off, the drive amplifier 312 stops amplifying to attenuate the TX nose leakage level of the HPA 302.

The RFC 505 prevents the operating point of the drive amplifier 312 from being changed due to a change in a gate bias level, which occurs when an RF signal transmitted through an RF path flows into a gate bias line. The bypass capacitor 504 blocks a residual RF signal that flows in through the RFC 505.

When the gate biases of the drive amplifier 312 and the main amplifier 322 are turned off in an RX mode, the output level of the HPA 302 can be calculated according to Equation (2):

$$-70\text{ dBm(HPA input level in }RX\text{ mode)}+25\text{ dB (gain of drive amp preamplifier)}=-45\text{ dBm} \quad (2)$$

Figure 1:
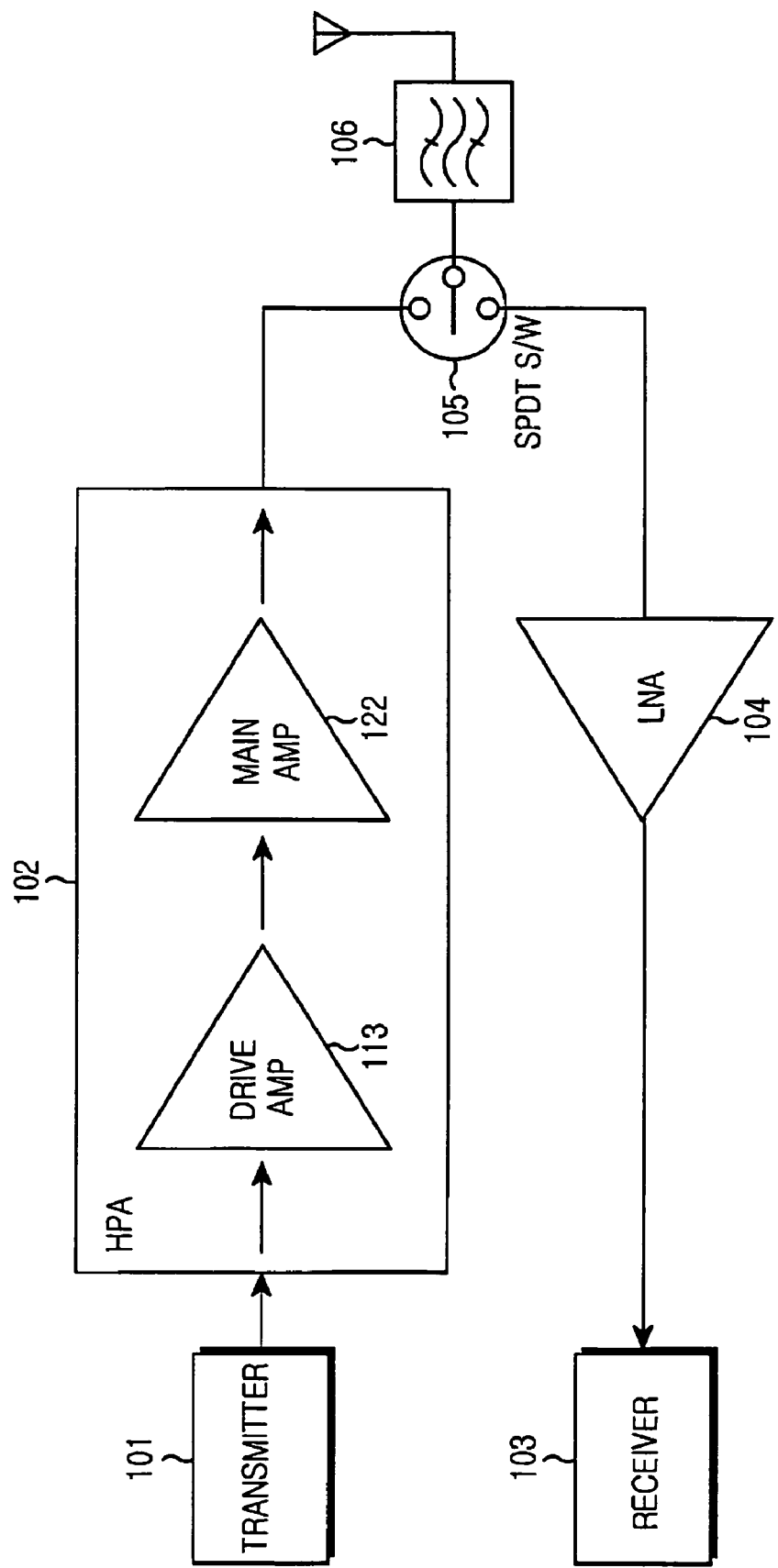
FIG. 1 is a block diagram of a conventional RF front-end device using an F switch.
Figure 2:
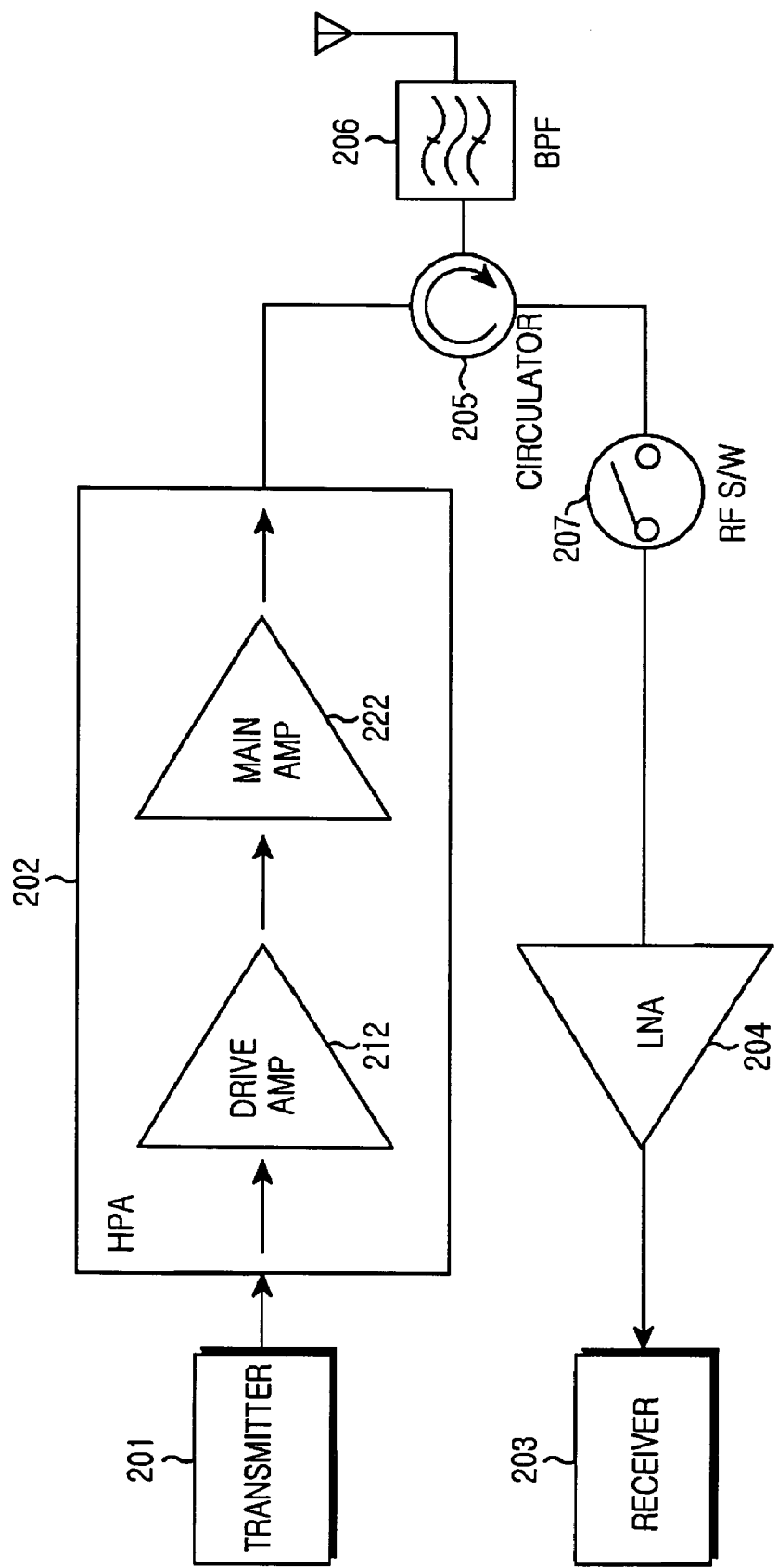
FIG. 2 is a block diagram of a conventional RF front-end device using a circulator.

It can be seen from the above that the output level of the HPA 302 is reduced by 30 dBm than the output level of the conventional HPA 202 in FIG. 2.

Figure 6:
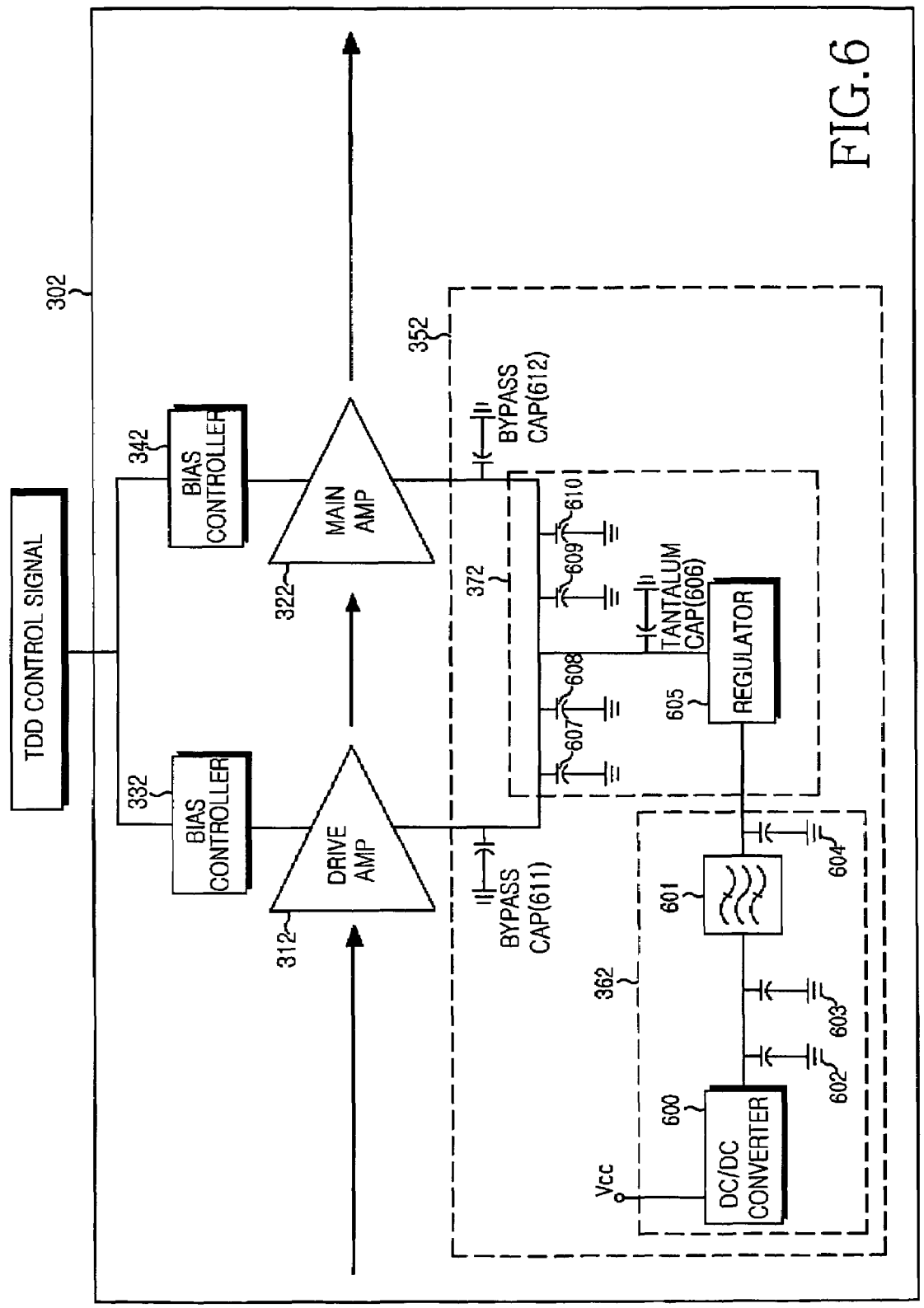
FIG. 6 is a diagram illustrating the detailed structure of a constellation error optimizer circuit illustrated in FIG. 4.

FIG. 6 is a diagram illustrating the detailed structure of a constellation error optimizer circuit illustrated in FIG. 4. A structure for controlling the drain bias of the drive amplifier 312 is identical to a structure for controlling the drain bias of the main amplifier 322. Thus, the following description will focus on a structure of the constellation error optimizer circuit 352 for providing a stable bias to the drive amplifier 312, for conciseness.

Referring to FIG. 6, the constellation error optimizer circuit 352 includes a current control circuit 362, a bias stabilizer circuit 372, and bypass capacitors 611 and 612. The current control circuit 362 removes a current fluctuation that occurs when the first and second bias controllers 332 and 342 are turned on. The bias stabilizer circuit 372 provides a stable voltage and removes a power noise, thereby stabilizing the bias.

The current control circuit 362 includes a DC/DC converter 600, a filter 601, and one or more capacitors 602, 603 and 604. The bias stabilizer circuit 372 includes a regulator 605, a tantalum capacitor 606, and one or more capacitors 607, 608, 609 and 610.

In the current control circuit 362, the DC/DC converter 600 a DC level of a received external power Vcc. The filter 601 performs a filtering operation to remove a current fluctuation. The capacitors 602, 603 and 604 remove a current spike fluctuation that occurs when the first and second bias controllers 332 and 342 are turned on.

In the bias stabilizer circuit 372, the regulator 605 converts the DC power, whose current fluctuation is reduced by the current control circuit 362, into a positive voltage. The tantalum capacitor 606 operates to provide a stable voltage. The capacitors 607, 608, 609 and 610 removes a power noise and to provide an stable drain bias to the drain of the amplifier.

The bypass capacitors 611 and 612 blocks a residual RF signal that flows into the bias stabilizer circuit 372.

Depending on the existence of the constellation error optimizer circuit 352, there is a difference between current fluctuations of biases that are provided to the drive amplifier 312 and the main amplifier 322. This will now be described with reference to FIGS. 8A and 8B.

Figure 8A:
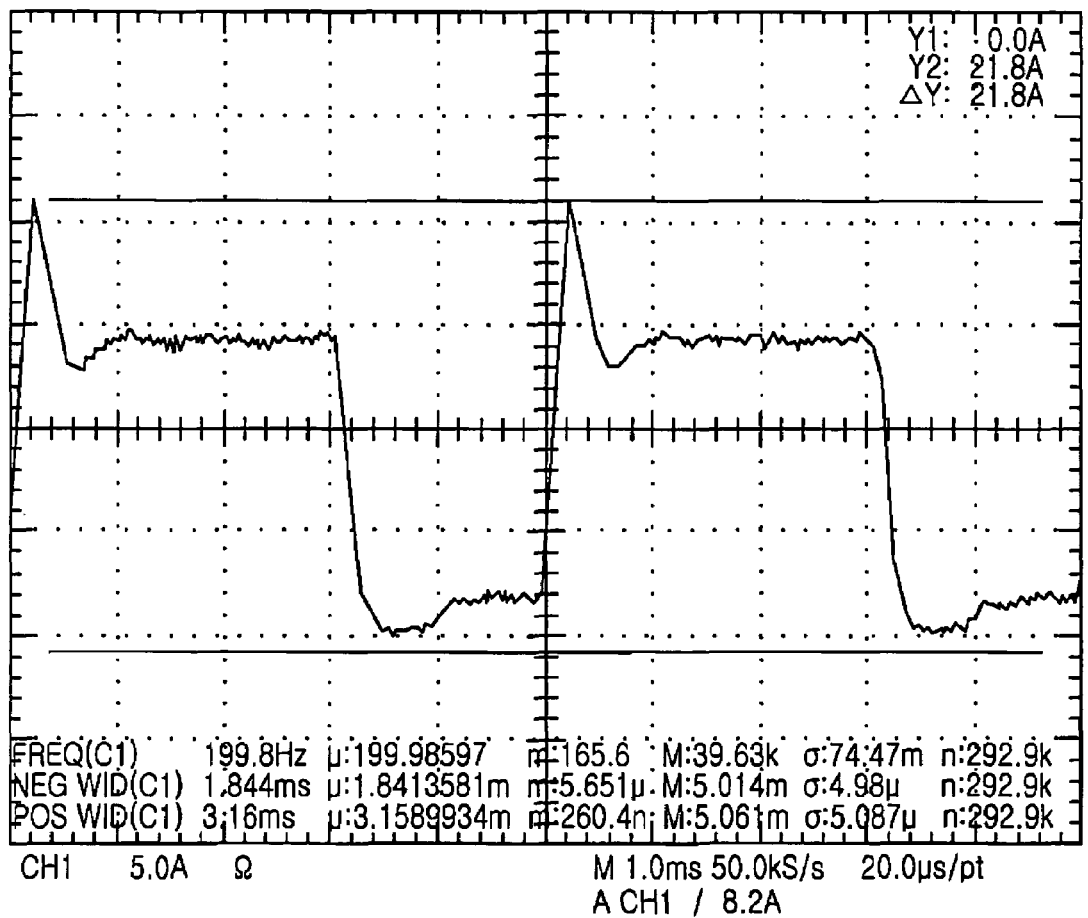
FIG. 8A is a graph illustrating the waveform of a current that is consumed by an HPA without the constellation error optimizer circuit.
Figure 8B:
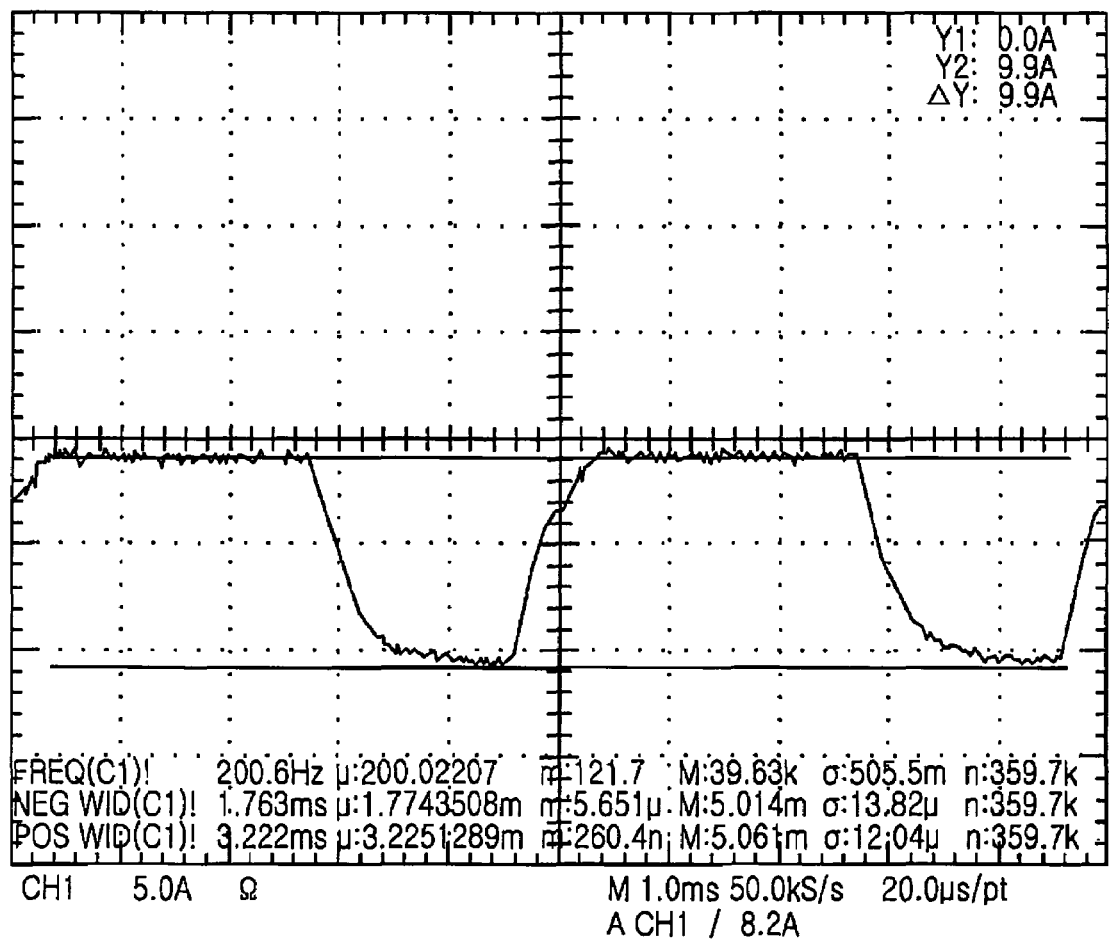
FIG. 8B is a graph illustrating the waveform of a current that is consumed by an HPA with the constellation error optimizer circuit.

FIG. 8A is a graph illustrating the waveform of a current that is consumed by the HPA without the constellation error optimizer circuit. FIG. 8B is a graph illustrating the waveform of a current that is consumed by the HPA with the constellation error optimizer circuit. In FIGS. 8A and 8B, an axis of abscissas and an axis of ordinates represent time and a current, respectively.

As can be seen from FIG. 8A, a spike occurs at a start point of the current waveform. This spike occurs when the first and second bias controllers 332 and 342 are turned on. This causes the instability of a bias supplied to the HPA and the irregularity of a supplied current, leading to an increase in a constellation error. An increase in the constellation error causes a decrease in an SNR, leading to the degradation of the system performance. In addition, a current increases abruptly to cause a hardware shock to the HPA, leading to a decrease in the circuit lifetime. Moreover, the operating range of the system power supply increases, leading to an increase in the system cost price.

Referring to FIG. 8B, the constellation error optimizer circuit 352 is added to remove the spike occurring at the start point of the current waveform, thereby providing the stability of the bias supplied to the HPA and the regularity of the supplied current. This reduces the constellation error of the HPA 302, resulting in the improvement of the SNR. In addition, the hardware shock to the HPA is removed to reduce the capacity of the system power supply, thereby reducing the system cost price.

Depending on the existence of the constellation error optimizer circuit 352, there is a difference between constellation errors, which is due to a difference between current fluctuations of biases that are provided to the drive amplifier 312 and the main amplifier 322. This will now be described with reference to FIGS. 9A and 9B.

Figure 9A:
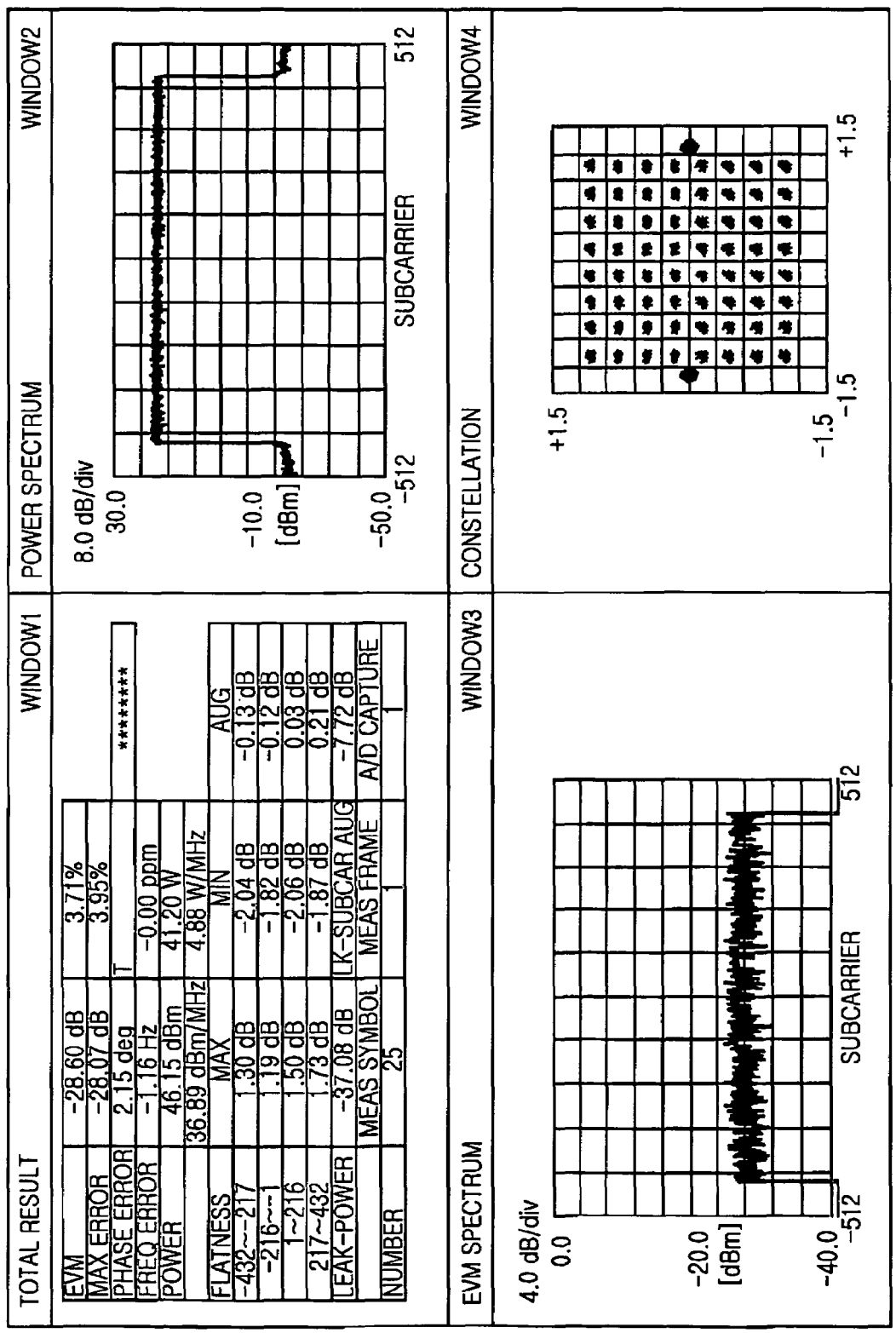
FIG. 9A is a diagram illustrating a constellation error in an HPA without the constellation error optimizer circuit.
Figure 9B:
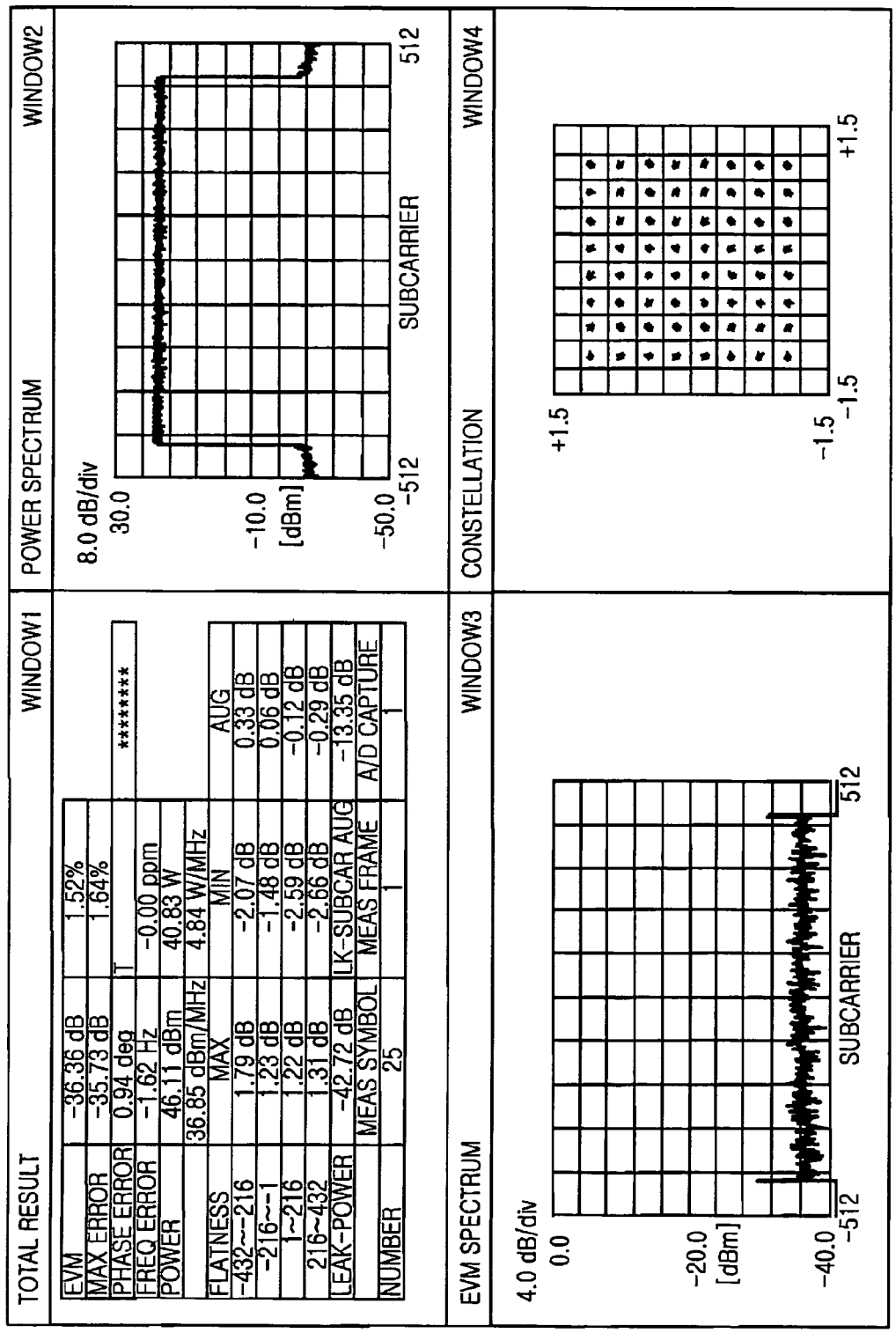
FIG. 9B is a diagram illustrating a constellation error in an HPA with the constellation error optimizer circuit.

FIG. 9A is a diagram illustrating a constellation error in the HPA without the constellation error optimizer circuit. FIG. 9B is a diagram illustrating a constellation error in the HPA with the constellation error optimizer circuit. In FIGS. 9A and 9B, "EVM" denotes a constellation error, dots at the bottom right indicates the constellations, and the wideness of the dots corresponds to the magnitude of the constellation error.

As can be seen from FIG. 9A, the HPA without the constellation error optimizer circuit 352 provides a constellation error of about −29 dB, which fails to satisfy the minimum constellation error value "−31.4 dB" at the output stage of the HPA that is required by a TDD communication system. This suggests that the conventional HPA without the constellation error optimizer circuit cannot satisfy the required constellation error value and thus cannot be applied to the TDD communication system.

As can be seen from FIG. 9B, the HPA with the constellation error optimizer circuit 352 provides a constellation error of about −36 dB that is less, by more than 6 dB, than the constellation error of the HPA without the constellation error optimizer circuit. This means that the HPA with the constellation error optimizer circuit 352 can be applied to the TDD communication system.

Figure 7:
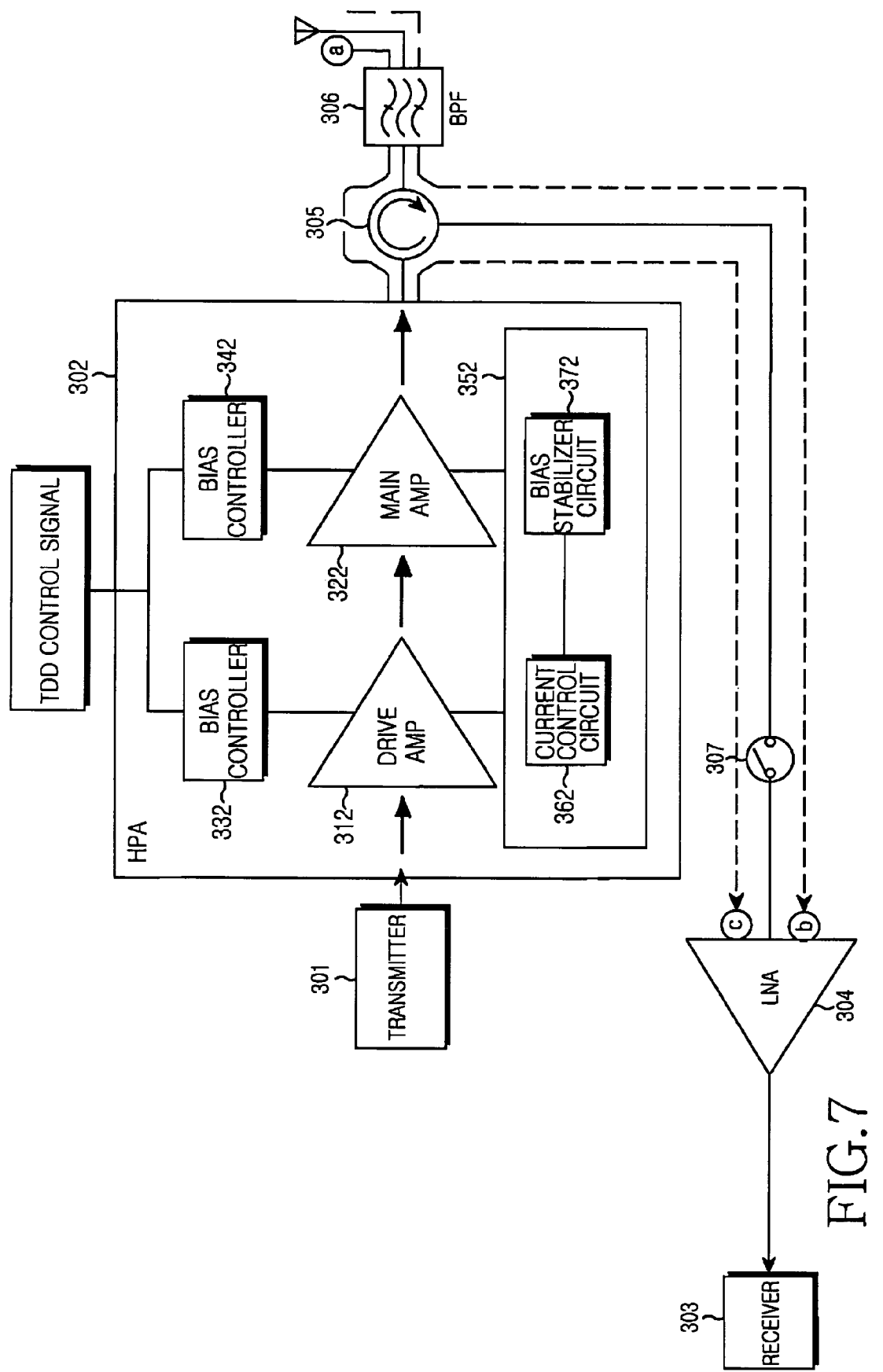
FIG. 7 is a diagram illustrating operations in TX/RX modes when the HPA is constructed as illustrated in FIG. 3.

FIG. 7 is a diagram illustrating operations in TX/RX modes when the HPA is constructed as illustrated in FIG. 3.

Referring to FIG. 7, a TX RF signal is transferred along path (a) in a TX mode. In the TX mode, the TDD control signal is in a "high" state. In accordance with the "high" TDD control signal, the RF switch 701 is switched to apply an input RF signal to the drive amplifier 312. In accordance with the "high" TDD control signal, the first switch 401 and the second switch 411 are also switched to turn on the gate biases of the drive amplifier 312 and the main amplifier 322. The drive amplifier 312 and the main amplifier 322 receive stable biases from the constellation error optimizer circuit 352 and amplify the RF signal from the switch 710 to output a high-power RF signal. The capacitor 602 and the bypass capacitor 612 are also turned on in accordance with the TDD control signal and thus an output RF signal of the main amplifier 322 is output through the output stage of the HPA 302. The HPA 302 has an output of 30~60 W or more. The TX RF signal, which is output as described above, is transferred to the filter 306 through the circulator 305 and is transmitted over the air through the antenna. At this point, the RF switch 307 on the RX path is turned off to block a leakage current that flows into the LNA 304. On the average, the insertion loss of the circulator 305 is about 0.2~0.3 dB. Considering a path loss from the filter 306 to the antenna, a path loss in the TX mode is about 2 dB.

In an RX mode, an RX RF signal is transferred along a path (b). An impact of the output level of the HPA 302 on the receiver will now be described throughout a path (c).

In the RX mode, the TDD control signal is in a "low" state. In accordance with the "low" TDD control signal, the RF switch 701 is switched to block a signal applied to the drive amplifier 312. In accordance with the "low" TDD control signal, the first switch 401 and the second switch 411 are also switched to turn off the gate biases of the drive amplifier 312 and the main amplifier 322, thereby stopping amplification of the drive amplifier 312 and the main amplifier 322. At this point, the capacitor 602 and the bypass capacitor 612 are also turned off in accordance with the TDD control signal, thereby attenuating power transferred to the output stage of the HPA 302. The output power of the HPA 302 flows into the LNA 304 through the circulator 305 and the RF switch 307.

When the input power level of the drive amplifier 312 during the off mode of the RF switch 701 is −104 dBm, the leakage level of a TX noise flowing into the LNA 304 along the path (c) can be calculated as shown in Equation (3):

$$-104\ dBm + 3\ dB\ (\text{HPA gain}) - 20\ dB\ (\text{the isolation of the circulator}) = -121\ dBm/10\ MHz \quad (3)$$

"3 dB" is the gain of the drive amplifier 312 and the main amplifier 322. "−121 dBm/10 MHz" is on the thermal noise level that does not affect the performance of the receiver. Such a decrease in the TX noise leakage level increases the SNR in the RX mode, thereby enhancing the RX sensitivity.

It should be noted that the gate biases of all the other amplifiers in the HPA could be controlled, as well as the gate biases of the drive amplifier and the main amplifier. For example, it is possible to control the gate bias of a pre-drive amplifier that may be located at the front end of the drive amplifier.

As described above, the gate bias of the HPA is controlled to provide a stable bias in the TX mode in the TDD wireless communication system, thereby reducing the constellation error to reduce the corresponding SNR. In addition, the TX noise leakage level, which is problematic in the RX mode, is reduced to reduce the corresponding SNR. The present invention enables smooth TDD communication, thereby solving the problems that may occur in practical implementation. In addition, the HPA consuming the majority of the system power is turned on/off to reduce the total power consumption, thereby enhancing the system efficiency.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A high-power amplifier (HPA) apparatus for a Time Division Duplex (TDD) wireless communication system, comprising:
   a power amplifier for amplifying the power of an input signal;
   a gate bias controller for turning on/off a gate bias of the amplifier in accordance with a TDD control signal; and
   a constellation error optimizer circuit being coupled to a drain of the power amplifier for removing a current fluctuation and a power noise,
   wherein the constellation error optimizer comprises:
   a bias stabilizer circuit for providing a stable voltage and removing a power noise to stabilize a drain bias of the power amplifier; and
   a current control circuit being coupled to the bias stabilizer circuit for removing a current fluctuation that occurs when the gate bias controller turns on the power amplifier.

2. The HPA apparatus of claim 1, wherein the current control circuit comprises:
   a direct current/direct current (DC/DC) converter for adjusting a DC level of a received external power;
   a filter connected to the converter for performing a filtering operation to reduce a current fluctuation; and
   a capacitor connected parallel to the converter and the filter for removing a current spike fluctuation that occurs when the gate bias controller turns on the power amplifier.

3. The HPA apparatus of claim 1, wherein the bias stabilizer circuit comprises:
   a regulator for receiving a direct current (DC) power from the current control circuit, and converting the received DC power into a positive voltage;
   a first capacitor connected parallel to the regulator for stabilizing the positive voltage output from the regulator; and
   a second capacitor connected parallel to the regulator near the power amplifier than the first capacitor for removing a power noise.

4. The HPA apparatus of claim 3, wherein the first capacitor is a tantalum capacitor.

5. The HPA apparatus of claim 3, wherein a capacity of the first capacitor is proportional to a capacity of a transistor in the power amplifier.

6. The HPA apparatus of claim 1, wherein the gate bias controller turns off the gate bias of the power amplifier in a receive (RX) mode.

7. The HPA apparatus of claim 1, wherein the gate bias controller comprises a single-pole single throw (SPST)

switch that is installed at a gate bias line of the power amplifier and is switched in accordance with the TDD control signal.

8. The HPA apparatus of claim 1, wherein the TDD control signal is a transistor-transistor logic (TTL) signal or a low-voltage TTL (LVTTL) signal.

9. A power amplifying apparatus in a Time Division Duplex (TDD) wireless communication system, comprising:
a first power amplifier for amplifying the power of an input signal;
a second power amplifier for amplifying the output signal of the first amplifier,
a first gate bias controller for turning on/off a gate bias of the first amplifier in accordance with a TDD control signal;
a second gate bias controller for turning on/off a gate bias of the second amplifier in accordance with the TDD control signal; and
a constellation error optimizer circuit being coupled to a drain of the second power amplifier for removing a current fluctuation and a power noise,
wherein the constellation error optimizer comprises:
a bias stabilizer circuit for providing a stable voltage and removing a power noise to stabilize a drain bias of the second power amplifier; and
a current control circuit being coupled to the bias stabilizer circuit for removing a current fluctuation that occurs when the gate bias controller turns on the power amplifier.

10. The apparatus of claim 9, wherein the current control circuit comprises:
a direct current/direct current (DC/DC) converter for adjusting a DC level of a received external power;
a filter connected to the converter for performing a filtering operation to reduce a current fluctuation; and
a capacitor connected parallel to the converter and the filter for removing a current spike fluctuation that occurs when the gate bias controller turns on the power amplifier.

11. The apparatus of claim 9, wherein the bias stabilizer circuit comprises:
a regulator for receiving a direct current (DC) power from the current control circuit, and converting the received DC power into a positive voltage;
a first capacitor connected parallel to the regulator for stabilizing the positive voltage output from the regulator; and
a second capacitor connected parallel to the regulator near the power amplifier than the first capacitor for removing a power noise.

12. A power amplifying apparatus in a Time Division Duplex (TDD) wireless communication system, comprising:
a first power amplifier for amplifying the power of an input signal;
a second power amplifier for amplifying the output signal of the first amplifier,
a first gate bias controller for turning on/off a gate bias of the first amplifier in accordance with a TDD control signal;
a second gate bias controller for turning on/off a gate bias of the second amplifier in accordance with the TDD control signal; and
a constellation error optimizer circuit being coupled to a drain of the first power amplifier and a drain of the second power amplifier for removing a current fluctuation and a power noise,
wherein the constellation error optimizer comprises:
a bias stabilizer circuit for providing a stable voltage and removing a power noise to stabilize a drain bias of first the power amplifier and the second power amplifier; and
a current control circuit being coupled to the bias stabilizer circuit for removing a current fluctuation that occurs when the gate bias controller turns on the first and second power amplifier.

13. The apparatus of claim 12, wherein the current control circuit comprises:
a direct current/direct current (DC/DC) converter for adjusting a DC level of a received external power;
a filter connected to the converter for performing a filtering operation to reduce a current fluctuation; and
a capacitor connected parallel to the converter and the filter for removing a current spike fluctuation that occurs when the gate bias controller turns on the first and the second power amplifier.

14. The apparatus of claim 12, wherein the bias stabilizer circuit comprises:
a regulator for receiving a direct current (DC) power from the current control circuit, and converting the received DC power into a positive voltage;
a first capacitor connected parallel to the regulator for stabilizing the positive voltage output from the regulator; and
a second capacitor connected parallel to the regulator near the power amplifier than the first capacitor for removing a power noise.

15. The apparatus of claim 12, wherein the first and the second gate bias controllers turn off the gate bias of the first and second power amplifiers respectively in a receive (RX) mode.

16. The apparatus of claim 12, wherein the first and second gate bias controllers comprise a single-pole single throw (SPST) switch that is installed at a gate bias line of the first and second power amplifier respectively.

17. The apparatus of claim 12, wherein the TDD control signal is a transistor- transistor logic (TTL) signal or a low-voltage TTL (LVTTL) signal.

* * * * *

UNITED STATES PATENT AND TRADEMARK OFFICE
CERTIFICATE OF CORRECTION

PATENT NO.       : 7,660,564 B2                                       Page 1 of 1
APPLICATION NO.  : 11/600511
DATED            : February 9, 2010
INVENTOR(S)      : Jong-Hyun Lee It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 577 days.

Signed and Sealed this

Twenty-eighth Day of December, 2010

David J. Kappos
*Director of the United States Patent and Trademark Office*